United States Patent [19]

Tischer et al.

[11] 4,420,785

[45] Dec. 13, 1983

[54] OVERVOLTAGE PROTECTION CIRCUIT FOR LINE AMPLIFIERS

[75] Inventors: Friedrich-Christian Tischer; Horst Kleinmann; Herwig Klinger, all of Backnang, Fed. Rep. of Germany

[73] Assignee: Licentia Patent-Verwaltungs-GmbH, Frankfurt am Main, Fed. Rep. of Germany

[21] Appl. No.: 274,443

[22] Filed: Jun. 17, 1981

[30] Foreign Application Priority Data

Jun. 18, 1980 [DE] Fed. Rep. of Germany ....... 3022677

[51] Int. Cl.[3] .............................................. H02H 3/20
[52] U.S. Cl. ..................................... 361/56; 361/91; 361/118
[58] Field of Search ................... 361/56, 91, 110, 111, 361/118, 119

[56] References Cited

U.S. PATENT DOCUMENTS 4,099,217  7/1978  Fitchew ................................ 361/56
4,202,024  5/1980  Simokat ............................... 361/91

FOREIGN PATENT DOCUMENTS 1462247  12/1970  Fed. Rep. of Germany ........ 361/56

OTHER PUBLICATIONS

Electronics & Power; pp. 559–560; Dec. 13, 1973.

Primary Examiner—Reinhard J. Eisenzopf
Attorney, Agent, or Firm—Spencer & Kaye

[57] ABSTRACT

In an overvoltage protection circuit for an amplifier inserted in series between lengths of a signal transmission line, the line including a ground path and the amplifier being supplied with operating power via the transmission line and including power supply inputs conductively connected to the transmission line lengths via a current supply filter, there is provided: one single overvoltage arrester for providing coarse overvoltage protection connected between the ground path and one of the power supply inputs, and lowpass filters connected between the arrester and each transmission line length.

7 Claims, 1 Drawing Figure

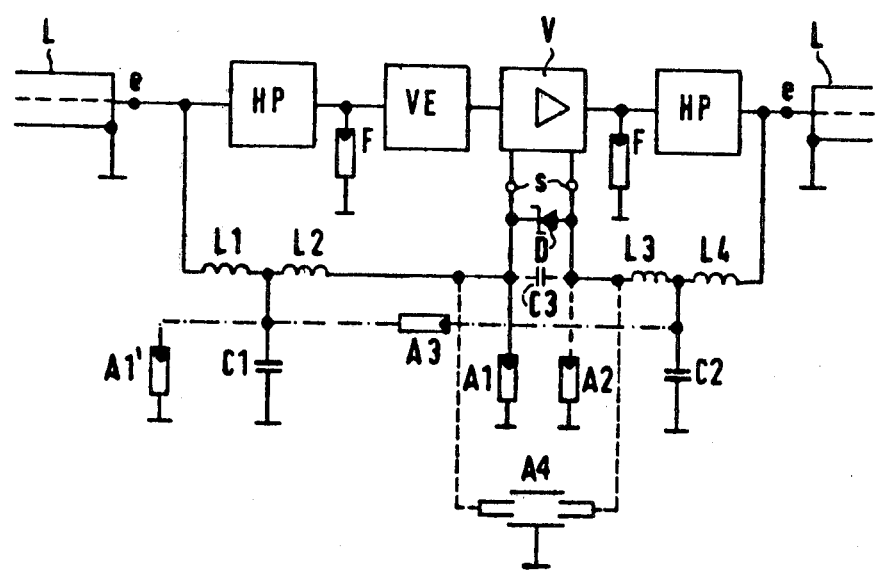

OVERVOLTAGE PROTECTION CIRCUIT FOR LINE AMPLIFIERS

BACKGROUND OF THE INVENTION

The present invention relates to an overvoltage protection circuit for a line amplifier fed remotely through the line.

Such overvoltage protection circuits are disclosed, for example, in "Technische Mitteilungen [Technical Reports] AEG-TELEFUNKEN", Annex: Analog Transmission Devices, 1977, on page 72, and in FIG. 1 on page 71, and in German Auslegeschrift [Published Application] No. 1,462,247. In these prior art protective circuits, overvoltage arresters are provided at each end of the line. These arresters conduct, or fire, when struck by lightning or under the influence of induction from power lines and thus protect the amplifier. However, the firing of the overvoltage arrestors produces steep voltage wave fronts which have high energy components over the entire transmission range of the line amplifiers and thus not only interfere with transmission but may even cause damage of the amplifier unless additional measures are provided.

German Offenlegungsschrift [Laid-open Application] No. 2,843,919 discloses a line amplifier including a circuit arrangement for providing coarse protection against overvoltages at the input and output, with an overvoltage arrester being provided only at the input of the line amplifier. This has the advantage that the above-mentioned steep voltage wave fronts during firing of the overvoltage arrester can act only on the amplifier input, which, however, is customarily provided with a pre-equalizer that strongly attenuates the lower transmission frequency range or weakly attenuates the medium transmission frequency ranege, respectively. But in this way only part of the pulse energy generated during firing of the overvoltage arrester, which energy is more or less distributed uniformly over the entire transmission range of the line amplifiers, is eliminated.

It is customary that protection of line amplifiers against overvoltages is set up in several steps for instance 2. In the latter case, the protection normally consists of coarse and fine protection, the difference being defined by different firing voltages.

SUMMARY OF THE INVENTION

It is therefore an object of the invention to provide an inexpensive overvoltage protection circuit for a remotely powered line amplifier of the above-identified type so as to provide better protection against high energy, high frequency pulses generated due to firing of the coarse protection overvoltage arresters.

The above and other objects are achieved, according to the present invention, in an overvoltage protection circuit for an amplifier inserted in series between lengths of a signal transmission line, the line including a ground path and the amplifier being supplied with operating power via the transmission line and including power supply inputs conductively connected to the transmission line lengths via power supply filters, by the provision of an overvoltage arrester for providing coarse overvoltage protection connected between the ground path and a point located between one line length and one of the power supply inputs, this point being separated from the line ports by a lowpass filter or sections of such filter.

The overvoltage protection circuit according to the invention provides improved protection against overvoltages produced by lightning, EMP or induction from power lines, with the same or reduced expenditures compared to prior art protective circuits.

The significance of the invention lies in the fact that coarse protection overvoltage arresters at the inputs and outputs of line amplifiers can be omitted by providing a coarse protection overvoltage arrester in the lowpass path of the current supply.

BRIEF DESCRIPTION OF THE DRAWING

The sole FIGURE is a circuit diagram of a preferred embodiment of a protection circuit according to the invention.

DESCRIPTION OF THE PREFERRED EMBODIMENTS

The FIGURE shows coaxial line L, in which a line amplifier V is inserted at the point of separation between the severed line ends e. A pre-equalizer VE is connected ahead of the amplifier signal input. Between the line ends e and the amplifier there are provided power supply filters at both the inputs and outputs. These filters include high pass filters HP in series in the signal transmission path and lowpass filters in the operating power, or supply current, path.

The supply current path is protected against excess currents by a protective diode D which is connected in parallel with, or across, the operating power supply inputs s.

To provide fine protection, the output of the amplifier and the input of the pre-equalizer, both lying in the signal transmission path, are each provided with an overvoltage arrester F of the type having a response, or firing, voltage customarily of about 90–100 volts, as a protection against overvoltage pulses having very steep edges.

A coarse protection overvoltage arrester A1 which has a significantly higher response voltage of about 1000 volts or more and which is provided as a protection against overvoltage pulses of a low edge steepness, is provided, according to the invention, in the lowpass path for the supply current for the amplifier. Advantageously, arrester A1 is connected to one power supply or feed input s of the amplifier.

With this arrangement, a slow overvoltage pulse, i.e. a pulse whose edges are not steep and which therefore does not contain high frequency components, coming for example from the left from line L, can travel through a lowpass T filter L1, C1, L2, or coming from the right-hand portion of the line L, through the lowpass T filter L4, C2, L3 at the output of the current supply filter and through the protective diode D to the overvoltage arrester A1 which responds if its firing voltage is reached. The resulting medium and high frequency, high energy pulses are greatly attenuated by the two above-mentioned T filters so that almost no interfering energy can reach the signal input and output of the amplifier.

The overvoltage arrester A1 according to the invention can be supplemented by a further coarse protection overvoltage arrestor A2 which is connected, as shown in broken lines, to the other power supply input s of the amplifier V.

A number of types of gas arresters may be used for A1 or A2, e.g. The Siemens type B2-B850 Q69-XA55 with a firing voltage of 1000 Vs.

It is also possible to use, instead of the arresters A1 and A2, a known overvoltage arrester A4 having three electrodes, with the common electrode being connected to ground and the other two electrodes being connected to respective ones of the power supply inputs s. The two discharge paths of such an arrester are coupled internally so that when one path fires, the other will fire as well after a very short time delay. As a result of this and because of the capacitor C3 which is connected in parallel with the diode D, the occurrence of high currents in the diode is prevented.

A number of types of gas arresters may be used for that arrester, e.g. The Siemens type T1-C350 Q69-X751 with a firing voltage of around 400 Vs, or similar arrestors with higher voltages.

There is another advantageous way of protecting the Zener diode, by connecting, according to a feature of the present invention, as shown by chain lines, instead of arresters A1 or A2 a coarse protection overvoltage arrester A1' to the star point of the left-hand T filter, i.e. the point of connection between components L1, L2 and C1, and additionally by connecting a third overvoltage arrester A3 between the star points of the two above-mentioned T filters of the current supply filters. With suitable selection of the values of the two inductances L1 and L4, the high energy pulses occurring in the transmission path upon firing of the coarse protection overvoltage arresters are likewise attenuated sufficiently toward the input and output of the amplifier.

For arresters A1' can be used the same type like for A1 and A2, for arresters A3 may be used the Siemens type A1 C90 Q69-X101 with a firing voltage of 90 Vs.

It will be understood that the above description of the present invention is susceptible to various modifications, changes and adaptations, and the same are intended to be comprehended within the meaning and range of equivalents of the appended claims.

What is claimed is:

1. In an overvoltage protection circuit for an amplifier having signal input means and signal output means and being inserted in series between lengths of a signal transmission line, the line including a ground path and the amplifier being supplied with operating power via the transmission line and including power supply inputs conductively connected to the transmission line lengths via a current supply filter, the improvement comprising: an overvoltage arrester for providing coarse overvoltage protection connected between said ground path and a point located between one said line length and one of said power supply inputs; and two lowpass filters which form part of said current supply filter each connected between said arrester and a respective one of said transmission line lengths so that high frequency, high energy pulses which are generated if said arrester is fired cannot reach either the signal input or signal output means.

2. A circuit as defined in claim 1 wherein said arrester is connected directly to one said supply input.

3. A circuit as defined in claim 2 wherein there are two said arresters each connected to a respective power supply input and one of said lowpass filters is connected between each said arrester and a respective one of said transmission line lengths.

4. A circuit as defined in claim 3 wherein said two arresters are together constituted by a three-electrode arrester device.

5. A circuit as defined in claim 3 wherein said arresters provide the only coarse overvoltage protection for said amplifier.

6. A circuit as defined in claim 3 wherein said amplifier has two said power supply inputs and further comprising a Zener diode connected in parallel between said power supply inputs.

7. A circuit as defined in claim 1 wherein: said amplifier has two said power supply inputs; said circuit additionally comprises a further voltage arrester; and there are sections of said lowpass filters connecting said further arrester to said supply inputs and said line lengths such that each end of said further arrester is connected to a respective line length via a respective lowpass section and to a respective supply input via a respective lowpass section.

* * * * *